United States Patent
Watanabe et al.

(10) Patent No.: US 7,515,623 B2
(45) Date of Patent: Apr. 7, 2009

(54) SURFACE EMITTING SEMICONDUCTOR LASER, ITS MANUFACTURING METHOD, AND MANUFACTURING METHOD OF ELECTRON DEVICE

(75) Inventors: Yoshiaki Watanabe, Kanagawa (JP); Hironobu Narui, Kanagawa (JP); Yuichi Kuromizu, Kanagawa (JP); Yoshinori Yamauchi, Tokyo (JP); Yoshiyuki Tanaka, Miyagi (JP)

(73) Assignee: Sony Corporation, Tokyo (JP)

( * ) Notice: Subject to any disclaimer, the term of this patent is extended or adjusted under 35 U.S.C. 154(b) by 294 days.

(21) Appl. No.: 11/143,806

(22) Filed: Jun. 2, 2005

(65) Prior Publication Data

US 2005/0271106 A1 Dec. 8, 2005

(30) Foreign Application Priority Data

Jun. 4, 2004 (JP) .......................... P2004-166869

(51) Int. Cl.
*H01S 5/00* (2006.01)
(52) U.S. Cl. .............................. 372/46.013; 372/50.11; 372/50.23
(58) Field of Classification Search ................ 372/50.23
See application file for complete search history.

(56) References Cited

U.S. PATENT DOCUMENTS

| 5,633,527 | A  | * | 5/1997 | Lear ........................... 257/432 |
| 6,545,335 | B1 | * | 4/2003 | Chua et al. .................. 257/499 |
| 6,661,823 | B1 | * | 12/2003 | Otoma et al. ............. 372/49.01 |
| 2003/0235226 | A1 | | 12/2003 | Ueki |
| 2005/0013334 | A1 | * | 1/2005 | Watanabe et al. ............. 372/44 |
| 2005/0286596 | A1 | * | 12/2005 | Mukoyama et al. ...... 372/50.23 |

FOREIGN PATENT DOCUMENTS

| JP | 10-056233 | * | 2/1998 |
| JP | 11-233888 | | 8/1999 |
| JP | 2001-77420 | | 3/2001 |
| JP | 2003-121611 | | 4/2003 |
| JP | 2004-22686 | | 1/2004 |
| JP | 2004-23087 | | 1/2004 |

* cited by examiner

*Primary Examiner*—Dung T Nguyen
(74) *Attorney, Agent, or Firm*—Sonnenschein Nath & Rosenthal LLP

(57) ABSTRACT

A surface emitting semiconductor laser which can perform laser oscillation in a single peak beam like that in a single lateral mode and a manufacturing method which can easily manufacture such a laser at a high yield are provided. When a surface emitting semiconductor laser having a post type mesa structure is formed on an n-type semiconductor substrate, a mesa portion is formed and up to a p-side electrode and an n-side electrode are formed. Thereafter, a voltage is applied across the p-side and n-side electrodes and the laser is subjected to a steam atmosphere while extracting output light, thereby forming an Al oxide layer onto a p-type $Al_wGa_{1-w}As$ layer as a top layer of a p-type DBR layer and forming refractive index distribution like that of a concave lens.

12 Claims, 13 Drawing Sheets

SURFACE EMITTING SEMICONDUCTOR LASER, ITS MANUFACTURING METHOD, AND MANUFACTURING METHOD OF ELECTRON DEVICE

CROSS REFERENCES TO RELATED APPLICATIONS

The present invention contains subject matter related to Japanese Patent Application No. 2004-166869 filed in the Japanese Patent Office on Jun. 4, 2004, the entire contents of which being incorporated herein by reference.

BACKGROUND OF THE INVENTION

1. Field of the Invention

The invention relates to a surface emitting semiconductor laser, its manufacturing method, and a manufacturing method of an electron device.

2. Description of the Related Arts

In recent years, attention has been paid to a VCSEL (Vertical Cavity Surface Emitting Laser) as a laser for optical communication. Such a surface emitting laser has a structure in which upper and lower surfaces of an active layer are sandwiched between an n-type reflective layer and a p-type reflective layer. Generally, a DBR (Distributed Bragg Reflector) made of a semiconductor multilayer film is used for each of the n-type reflective layer and the p-type reflective layer.

Generally, a structure called a post type mesa structure is used as a structure of the surface emitting laser (for example, refer to Patent Document 1: JP-A-2001-210908). FIG. 15 shows an example of the surface emitting laser having such a post type mesa structure. As shown in FIG. 15, to manufacture such a surface emitting laser, an n-type DBR layer 102, a lower clad layer 103, an active layer 104, an upper clad layer 105, a p-type AlAs layer 106, a p-type DBR layer 107, and a p-type GaAs contact layer 108 are sequentially grown on an n-type GaAs substrate 101. After that, the lower clad layer 103, active layer 104, upper clad layer 105, p-type AlAs layer 106, p-type DBR layer 107, and p-type GaAs contact layer 108 are anisotropically etched in the direction perpendicular to the substrate surface by lithography and dry etching, thereby working into a cylindrical mesa shape having a diameter of about 30 µm. Subsequently, by selectively oxidizing the p-type AlAs layer 106 from an outer periphery, an oxide layer 109 is formed in a ring shape. A current constriction structure to inject a current into the active layer 104 at high efficiency is formed. Subsequently, a ring-shaped p-side electrode 110 is formed in the mesa upper portion. An n-side electrode 111 is formed on the back surface of the n-type GaAs substrate 101. An opening portion of the p-side electrode 110 becomes a light outgoing window. In the surface emitting laser, by applying a voltage across the p-side electrode 110 and the n-side electrode 111 and injecting a current into the active layer 104, a laser resonance occurs between the n-type DBR layer 102 and the p-type DBR layer 107 and a laser beam is taken out in the direction perpendicular to the substrate surface. In the surface emitting laser, if the current constriction diameter (diameter of the p-type AlAs layer 106) is equal to about 15 µmφ, the current is uniformly and efficiently injected into the active layer 104 just under the p-type AlAs layer 106, so that the efficient laser oscillation can be performed.

In such a surface emitting laser, control of a lateral mode for oscillating is an important problem. Ordinarily, it has been known that an FFP (Far Field Pattern) of the surface emitting laser which has been put into practical use is liable to become a multi-mode pattern having two or more peaks. On the other hand, in order to couple a laser beam with a fiber through a lens upon applying to communication or the like, a beam in a Gaussian distribution shape of a single peak (generally, beam of a single lateral mode) is still necessary from a viewpoint of an optical design.

As shown in FIG. 16, however, in the surface emitting laser of the post type mesa structure, particularly, in the case of selectively oscillating the single lateral mode of the single peak, a method of decreasing the current constriction diameter of the p-type AlAs layer 106 is generally used. That is, since a size of constriction diameter is almost proportional to the number of modes to be excited, if a current injecting region is narrowed to a certain degree, naturally, the single mode which is excited in a narrow area can be obtained as output light. However, if such a method is used, since it is necessary to extremely decrease the constriction diameter to 4 µmφ or less (refer to Non-Patent Document 1: M. Grabherr et al., "IEEE. Photon. Tech. Lett", Vol. 9, No. 10, page 1304, or the like), an allowable width is narrow to uniformly manufacture the current constriction structure with high controllability on a wafer and a manufacturing yield of the surface emitting laser deteriorates extremely. Since the current is concentratedly injected to the region of the p-type AlAs layer 106 whose area is smaller than that of the ordinary surface emitting laser by one digit and such a narrow region, a device resistance is high (normally, 100 Ω or more), an output is small, and efficiency is also low. High-frequency driving which is inherently necessary for communication is also difficult as a result of impedance mismatching. Since single mode performance has output dependency, there is a deterioration tendency (mode competition, or the like) at the time of the high-frequency driving, or the like, it is considered to be difficult to apply such a surface emitting laser to light transmission of the high-frequency driving.

In Patent Document 2 (JP-A-9-246660), there has been proposed a surface emitting semiconductor laser apparatus constructed in such a manner that an n-type GaAlAs optical guide layer, an active layer, and a p-type GaAlAs optical guide layer are sequentially grown on an n-type GaAs substrate, a circular diffraction grating is formed on the p-type GaAlAs optical guide layer, an n-type GaAlAs current block layer is grown on the diffraction grating, a window is formed in the n-type GaAlAs current block layer, and a p-type GaAlAs optical guide layer is further grown on the window. However, according to Patent Document 2, since the diffraction grating is formed by the lithography and the etching, such a technique differs from the present invention in which the refractive index distribution is formed in the outgoing window portion by oxidization.

SUMMARY OF THE INVENTION

It is desirable to provide a surface emitting semiconductor laser which can perform laser oscillation in a single peak beam like a single lateral mode and a manufacturing method of a surface emitting semiconductor laser whereby such a surface emitting semiconductor laser can be easily manufactured at a high yield.

It is also desirable to provide a manufacturing method of an electron device whereby electron devices such as transistors and the like can be easily separated.

The inventors of the present invention have vigorously examined the foregoing problems. An outline of such an examination will now be described.

According to knowledge obtained by various experiments executed by the inventors, the following result is obtained:

with respect to an oscillation lateral mode of the surface emitting laser, not only the current constriction diameter but also an optical state of the mesa upper surface serving as a light-emitting outermost surface, in detail, refractive index distribution near it has an extremely big influence and the mode is extremely sensitive to a small change in the refractive index or shape. Therefore, mesa upper surface shapes in various states are formed and relations with the oscillating mode are examined, so that it has been found that the oscillating mode is largely influenced not only by the shape of the semiconductor surface of the mesa upper surface but also by a structure of an electrode just over it. Further, it has been found in the above manufacturing step that in the shape of a semiconductor—an electrode shown in FIG. 1A, oscillation in a single peak beam like a single lateral mode can be stably obtained. In FIG. 1A, reference numeral 1 denotes a DBR layer; 2 a contact layer; 3 an insulative layer; and 4 an electrode. This mechanism is considered as follows. First, this structure includes the three elements of the contact layer 2, the insulative layer 3, and the electrode 4. This structure is decomposed into the following optical elements. First of all, each of the contact layer 2 remaining in a ring shape due to window opening etching and the insulative layer 3 likewise remaining in a ring shape on a mesa due to insulative layer window opening etching has a stairway-like shape and a state of a concave lens 5 just shown in FIG. 1B is formed as refractive index distribution. As for another one of them, an aperture structure 6 which is formed by the electrode 4 made of, for example, gold (Au) and is smaller than a window bore of the contact layer 2 is formed near the mesa center. The aperture structure 6 is equivalent to a refractive index distribution structure in which a convex lens 7 shown in FIG. 1B and an absorptive opening, that is, the aperture structure 6 are synthesized through a complex refractive index of gold (for example, a real part of the refractive index is equal to 0.2 and an imaginary part (absorption coefficient) is equal to 5.6 with respect to light having a wavelength of 0.85 µm). This means that a compound optical system is formed together with the concave lens 5. Moreover, since those structures are arranged in contact with a resonator of the surface emitting laser, they function as a part of the resonator structure. At this time, it is considered that, as shown in FIG. 1B, since the higher-order mode among laser resonance modes selected to a certain degree by an oxide constriction aperture structure 8 has a wide outgoing angle, this mode is fetched as a resonance condition in the resonator through processing steps such as scattering in the concave lens 5 structure, absorption in the absorptive opening, and further, convergence in the convex lens 7, almost one mode is forcedly selected due to the operation of a combination with the oxide constriction aperture structure 8, and the oscillation in the single lateral mode is executed.

The inventors of the present invention have further examined on the basis of the above study, so that they have found a method whereby, in order to further improve the foregoing effects, by forming the refractive index distribution like that of a concave lens to the light outgoing plane itself, the effect is given to the oscillating light mode itself, thereby suppressing the higher-order mode and realizing the single mode. It has been found that, in order to form the refractive index distribution like that of the concave lens to the light outgoing plane, it is effective to oxidize the light outgoing plane by subject it to an oxidizing atmosphere, particularly, a steam atmosphere while irradiating light to the light outgoing plane.

That is, although AlGaAs is used for the light outgoing plane in, for example, GaAs VCSEL (wavelength is equal to 850 nm), GaInNAs VCSEL (wavelength is equal to 1300 nm), or the like, it is known that such AlGaAs fetches oxygen of an atmosphere such as an air and naturally oxidizes it. Particularly, when a quantity of Al composition is large, such oxidization is remarkable and a mechanism for oxidization used for the current constriction of VCSEL is the same as that of such oxidization. It has also been well-known that AlGaAs can be easily oxidized through the moisture in the atmosphere and an oxidizing reaction progresses when a temperature is high. It is a well-known fact that prior to shipping a semiconductor device as well as the surface emitting laser, what is called burn-in in which by setting the device into a current supplying state at a high temperature and holding it for a predetermined time, subsequent characteristics become stable is effective.

In the surface emitting laser, an oxide layer can be formed onto the light outgoing plane in a form that is optimum to realize the single mode by executing the burn-in in the high-humidity atmosphere. In other words, in the case of supplying a current to the surface emitting laser, it is possible to set the laser into a beam shape of a single peak by adjusting the current. It is easily presumed that AlGaAs on the light outgoing plane is oxidized by subjecting the surface emitting laser to the high-humidity atmospheric environment while taking out the output light in the single peak beam shape. In this instance, however, it has been experimentally been found that the oxidizing reaction is progressed by the emitted light, the portion to which the light has strongly been irradiated is coupled with a larger quantity of oxygen, and an oxidization depth becomes deeper. Such a phenomenon can be easily analyzed by an EDX analysis. Such a phenomenon is a reaction which has progressed through the light as a catalyst and reproducibility is also high. As a result of this reaction, the refractive index distribution like that of the concave lens whose refractive index becomes smaller as a position approaches the center is formed on the light outgoing plane and the laser enters the state where it directly exerts an influence on a wave front of the oscillating light. An atmospheric temperature, a humidity (steam), a composition (Al composition) of the light outgoing plane, a substrate temperature, a supplying current, light intensity distribution, and the like can be mentioned as factors which determine a degree of the oxidization and its shape. As a result of the burn-in experiments which were actually performed, it has been confirmed that the AlGaAs surface is oxidized along the light intensity distribution.

The invention is made on the basis of the above examination.

That is, to solve the above problems, according to an embodiment of the first invention, there is provided a surface emitting semiconductor laser which comprises a first reflective layer, an active layer on the first reflective layer, and a second reflective layer on the active layer and extracts output light from the second reflective layer, wherein an oxide layer having predetermined refractive index distribution is formed on the second reflective layer.

According to an embodiment of the second invention, there is provided a manufacturing method of a surface emitting semiconductor laser which comprises a first reflective layer, an active layer on the first reflective layer, and a second reflective layer on the active layer and extracts output light from the second reflective layer, wherein an oxide layer is formed on the second reflective layer by performing oxidization while irradiating light having predetermined intensity distribution.

The oxide layer has the predetermined refractive index distribution in the first and second inventions and this predetermined refractive index distribution can be obtained by distribution of a thickness (depth) of the oxide layer and/or distribution of a composition (density) of the oxide layer. This predetermined refractive index distribution is, typically, refractive index distribution like that of the concave lens. Although the oxide layer fundamentally may be an arbitrary oxide layer so long as the necessary refractive index distribution can be obtained by oxidizing while irradiating the light, it is typically an Al oxide layer. Typically, the oxide layer is a compound semiconductor layer containing Al, particularly, a III-V group compound semiconductor layer containing Al. As a III-V group compound semiconductor layer containing Al, specifically speaking, for example, there is an AlGaAs layer, an AlGaInP layer, or the like. Particularly, assuming that the Al composition is expressed by "x", a value of x lies within a range of (0<x<1), preferably, (0.3<x<0.9).

Typically, although the oxidization is executed in order to form the oxide layer while extracting the output light having the predetermined intensity distribution from the second reflective layer, a similar effect can be obtained by oxidizing while irradiating the light having the predetermined intensity distribution from the outside. Preferably, the oxidization is executed by irradiating the light having the predetermined intensity distribution in the steam atmosphere. Preferably, the steam atmosphere of a temperature of 60° C. or more and a humidity of 60% or more is used as a steam atmosphere. Typically, the compound semiconductor layer containing Al is formed in the top portion of the second reflective layer and the compound semiconductor layer containing Al is oxidized while irradiating the light having the predetermined intensity distribution, thereby forming the oxide layer. After the oxide layer is formed, in order to suppress the progress of the subsequent oxidization and stabilize such a state, preferably, a protective film such as $SiN_x$ film formed by a CVD method or the like or organic film formed by a coating method or the like is formed, thereby covering the oxide layer. The oxide layer is formed, preferably, in the state of a wafer.

The first and second reflective layers are, typically, a semiconductor multilayer film (DBR), one of them is an n type, and the other is a p type. Each of the active layer and the second reflective layer has, typically, a cylindrical shape, that is, a mesa type post structure. Further typically, a contact layer having a circular opening is formed on the second reflective layer. The oxide layer is formed on the second reflective layer in the opening of the contact layer. An electrode having a circular opening of a diameter smaller than that of the opening of the contact layer is formed over the contact layer and the second reflective layer. An oxide layer is formed on the second reflective layer in the opening of the electrode. An insulative layer is formed between the contact layer and the electrode. The above structure is similar to that described with reference to FIGS. 1A and 1B.

According to an embodiment of the third invention, there is provided a manufacturing method of an electron device having a compound semiconductor layer containing Al, wherein an oxide layer is formed in the compound semiconductor layer containing Al by oxidizing while irradiating light having predetermined intensity distribution.

The devices can be separated by forming the oxide layer to a desired depth into the compound semiconductor layer containing Al. The compound semiconductor layer containing Al is, typically, a III-V group compound semiconductor layer containing Al. The electron devices are, typically, semiconductor devices such as transistors or the like.

In the third invention, the contents described in conjunction with the first and second inventions are satisfied so long as they are not contradictory to their nature.

In the invention constructed as mentioned above, by oxidizing while irradiating light having the predetermined intensity distribution, the oxidization using the light as a catalyst progresses in accordance with the intensity distribution, so that the oxide layer having the predetermined refractive index distribution can be formed on the second reflective layer.

According to the embodiments of the invention, by setting the refractive index distribution of the oxide layer to the refractive index distribution like that of the concave lens, the higher-order mode can be suppressed at the time of the laser oscillation and the oscillation in the single mode can be performed. Therefore, the surface emitting semiconductor laser which can perform the laser oscillation in the single peak beam like that of a single lateral mode can be obtained. The oxide layer having the target refractive index distribution can be formed by merely subjecting it to the oxidizing atmosphere while irradiating the light. There is no need to extremely reduce the current constriction diameter in order to oscillate in the single lateral mode. Therefore, such a surface emitting semiconductor laser can be easily manufactured at a high yield. Further, in the electron devices, they can be easily separated by the oxide layer.

DETAILED DESCRIPTION OF THE PREFERRED EMBODIMENTS

Figure 1A:
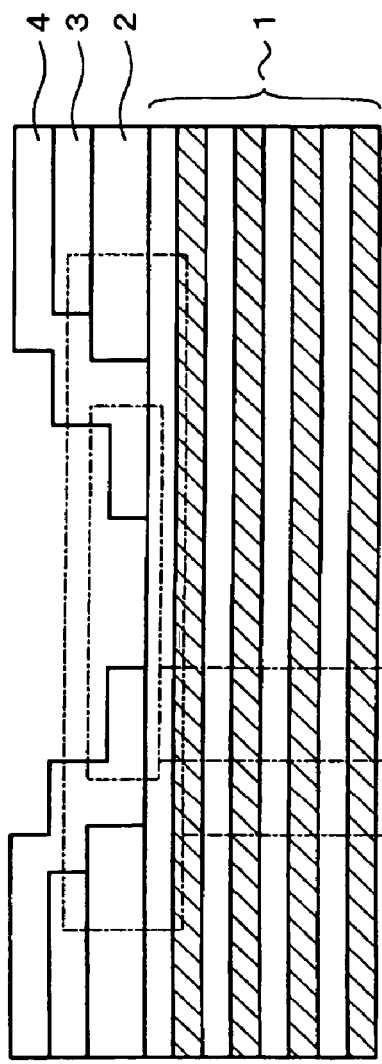
FIGS. 1A and 1B are schematic diagrams for explaining a structure for oscillating a surface emitting semiconductor laser in a single mode.

Embodiments of the invention will be described hereinbelow with reference to the drawings. The same or corresponding portions in all of the drawings of the embodiments are designated by the same reference numerals.

Figure 2:
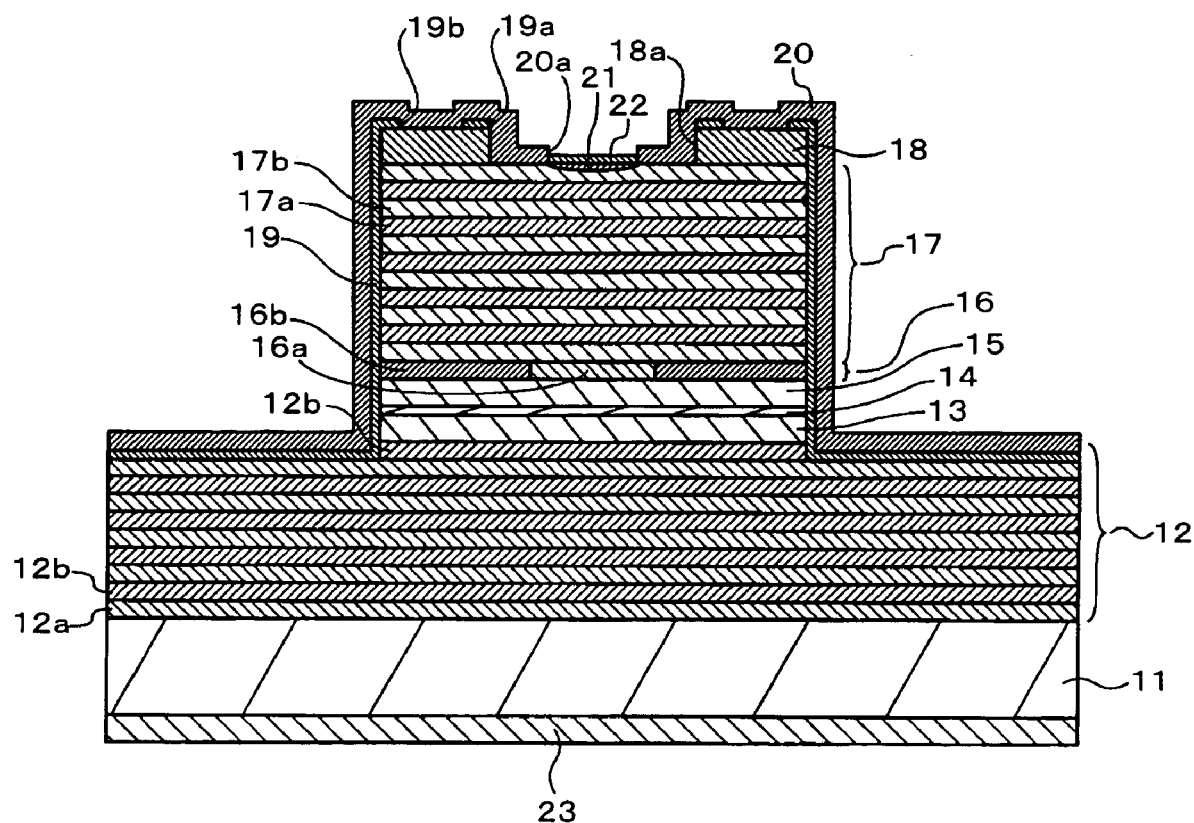
FIG. 2 is a cross sectional view showing the surface emitting semiconductor laser according to an embodiment of the invention.
Figure 3:
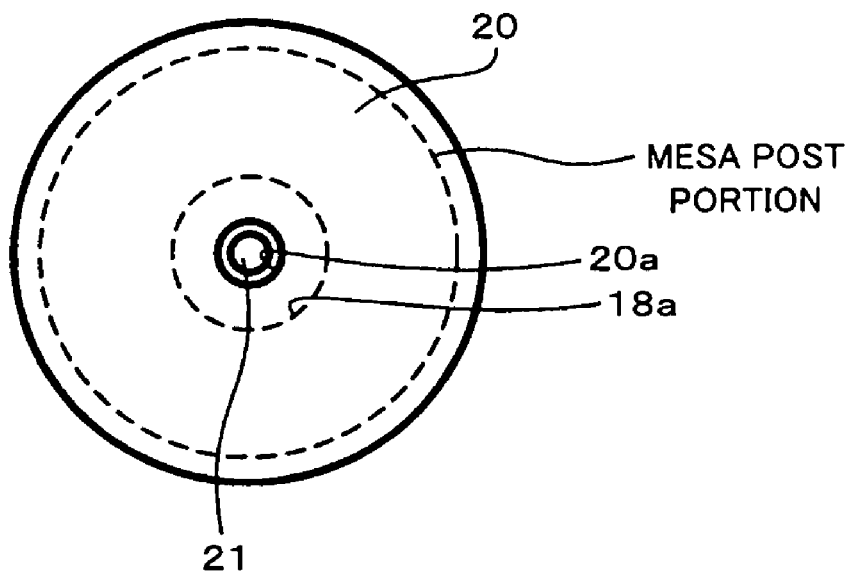
FIG. 3 is a plan view of a mesa portion of the surface emitting semiconductor laser according to the embodiment of the invention.
Figure 4:
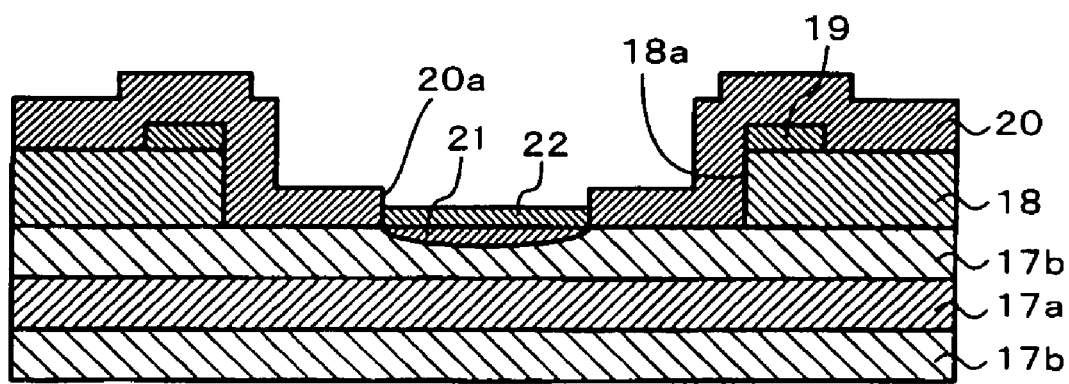
FIG. 4 is a cross sectional view enlargedly showing portions near a light outgoing portion of the surface emitting semiconductor laser according to the embodiment of the invention.

FIG. 2 is a cross sectional view showing a surface emitting semiconductor laser according to the embodiment of the invention. FIG. 3 is a plan view of a mesa post portion of the surface emitting semiconductor laser. FIG. 4 is an enlarged cross sectional view of portions near a light outgoing portion of the surface emitting semiconductor laser.

As shown in FIGS. 2 to 4, in the surface emitting semiconductor laser, for example, an n-type DBR layer 12, a lower clad layer 13, an active layer 14 as a light-emitting layer, an upper clad layer 15, a current constriction layer 16, a p-type DBR layer 17, and a p-type contact layer 18 are sequentially laminated on an n-type semiconductor substrate 11 like an n-type GaAs substrate.

The n-type DBR layer 12 is a semiconductor multilayer film obtained by alternately laminating an n-type AlAs layer 12a and an n-type GaAs layer 12b. For example, those layers are laminated by 35 periods, so that a total thickness of the laminated layer is equal to about 4 µm. The lower clad layer 13 is made of, for example, $Al_xGa_{1-x}As$ and, for example, x=0.3. The active layer 14 is made of, for example, GaAs. The upper clad layer 15 is made of, for example, $Al_yGa_{1-y}As$ and, for example, y=0.3. The current constriction layer 16 has a structure in which a periphery of a circular p-type AlAs layer 16a is surrounded by a ring-shaped Al oxide layer 16b. The p-type AlAs layer 16a becomes a portion in which a current flows. A diameter of p-type AlAs layer 16a is equal to, for example, about 12 µm. A thickness of each of the p-type AlAs layer 16a and the Al oxide layer 16b is equal to, for example, about 30 nm. The p-type DBR layer 17 is a semiconductor multilayer film obtained by alternately laminating a p-type $Al_zGa_{1-z}As$ layer 17a and a p-type $Al_xGa_{1-x}As$ layer 17b (where, z>w, 0<z, w<1). For example, those layers are laminated by 25 periods, so that a total thickness of the laminated layer is equal to about 3 µm. For example, z=0.9 and w=0.1. The current constriction layer 16 is provided in place of the p-type $Al_xGa_{1-x}As$ layer 17a as a lowest layer of the p-type DBR layer 17. The p-type contact layer 18 is made of p-type GaAs whose thickness is equal to, for example, about 150 nm and whose impurity concentration is equal to $5\times10^{18}$ cm$^{-3}$.

The n-type GaAs layer 12b as a top layer of the n-type DBR layer 12, the lower clad layer 13, the active layer 14, the upper clad layer 15, the current constriction layer 16, the p-type DBR layer 17, and the p-type contact layer 18 have a cylindrical shape as a whole and have a post type mesa structure. A diameter of this mesa portion is equal to, for example, about 30 to 40 µm. The p-type contact layer 18 has a circular opening 18a in a center portion and has a ring shape. A diameter of opening 18a is equal to, for example, about 20 µm.

An insulative film 19 made of an $SiO_2$ film or an $SiN_x$ film is formed so as to cover the surface of the mesa portion and the surface of the n-type DBR layer 12 in the portion other than the mesa portion. A thickness of insulative film 19 is equal to, for example, about 300 nm. An opening 19a having the same diameter as that of the opening 18a is formed in the insulative film 19 in the position which coincides with that of the opening 18a of the p-type contact layer 18. A ring-shaped opening 19b is formed on the outside of the opening 19a. A p-side electrode 20 is provided so as to be in ohmic-contact with the p-type contact layer 18 through the opening 19b. The p-side electrode 20 is made of, for example, a Ti/Pt/Au laminate film and its total thickness is equal to about 500 nm. The p-side electrode 20 has a circular opening 20a in a center portion and has a ring shape. A diameter of opening 20a of the p-side electrode 20 is smaller than that of the opening 18a of the p-type contact layer 18 and is equal to, for example, about 14 µm.

Figure 1B:
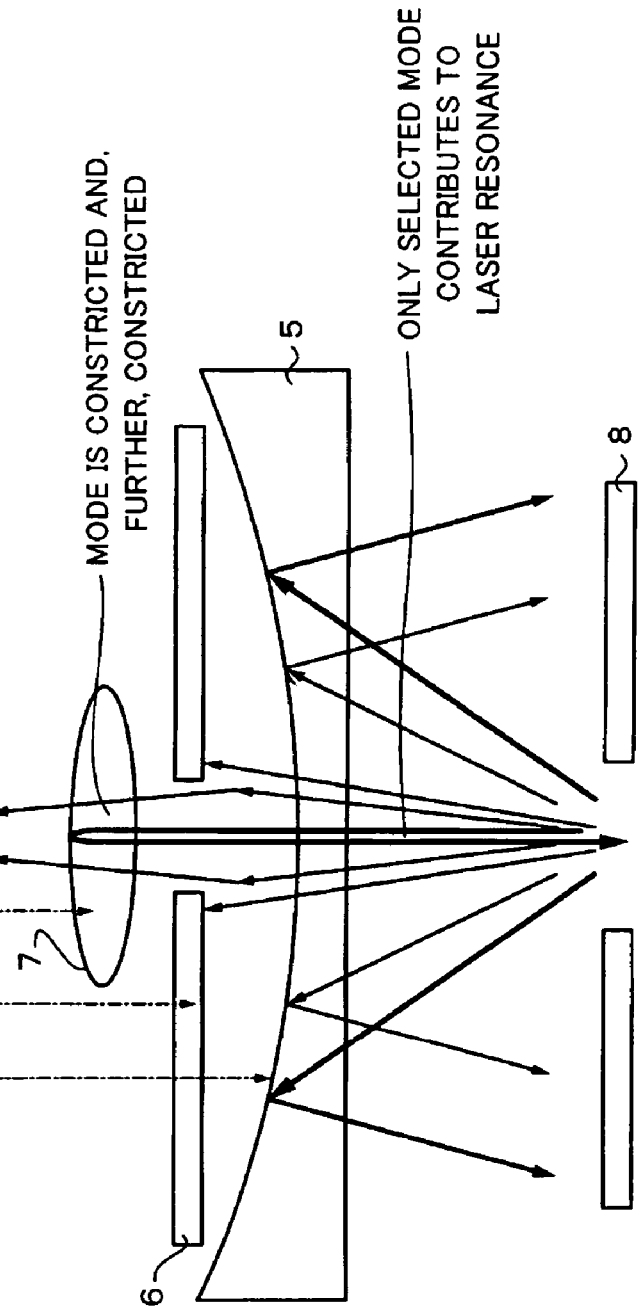

The structure constructed by the p-type contact layer 18, the insulative film 19, and the p-side electrode 20 is substantially the same as that described with reference to FIGS. 1A and 1B.

An Al oxide layer 21 is formed in a circular shape in the p-type $Al_wGa_{1-w}As$ layer 17b as a top layer of the p-type DBR layer 17 in the opening 20a of the p-side electrode 20 (refer to FIG. 3). A thickness of p-type $Al_wGa_{1-w}As$ layer 17b as a top layer is set to, for example, about 60 nm and w is set to a value within a range of (0.3<w<0.9). A thickness of Al oxide layer 21 increases from its outer peripheral portion toward its center portion and becomes the maximum in the center portion. The Al oxide layer 21 has a flat convex lens shape. A thickness of center portion of the Al oxide layer 21 is equal to, for example, about 10 nm. In addition to the increase in thickness, a density of an Al-O coupling increases from its outer peripheral portion toward the center portion and becomes the maximum in the center portion. Since a density of the Al oxide layer 21 is smaller than that of the p-type $Al_wGa_{1-w}As$ layer 17b, a refractive index of the Al oxide layer 21 decreases from its outer peripheral portion toward the center portion in correspondence to distribution of the thickness of Al oxide layer 21 or distribution of the density of the Al—O coupling and becomes the minimum in the center portion. The Al oxide layer 21 has refractive index distribution like that of the concave lens. A protective film 22 made of, for example, an $SiN_x$ film, an organic film, or the like is formed on the Al oxide layer 21 so as to cover it.

An n-side electrode 23 is formed on the back surface of the n-type semiconductor substrate 11 so as to be ohmic-contact therewith. The n-side electrode 23 is made of, for example, an AuGe/Ni/Au laminate film.

A manufacturing method of the surface emitting semiconductor laser constructed as mentioned above will now be described.

Figure 5:
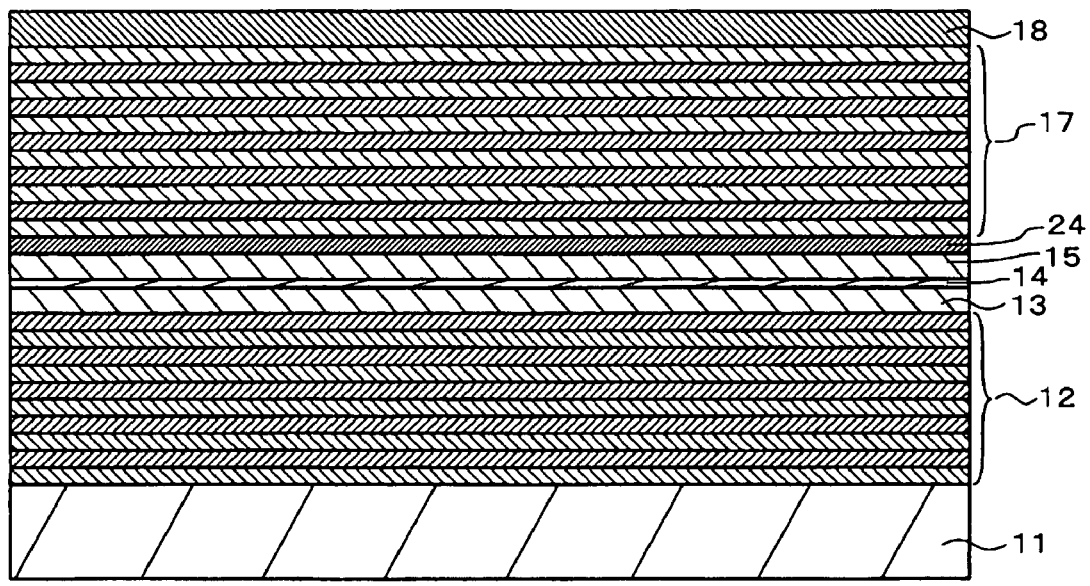
FIG. 5 is a cross sectional view for explaining a manufacturing method of the surface emitting semiconductor laser according to the embodiment of the invention.

As shown in FIG. 5, first, the n-type DBR layer 12, the lower clad layer 13, the active layer 14, the upper clad layer 15, a p-type AlAs layer 24, the p-type DBR layer 17, and the p-type contact layer 18 are sequentially grown on the n-type semiconductor substrate 11 by, for example, an organometal chemical vapor phase growing (MOCVD) method.

Subsequently, for example, an $SiN_x$ film (not shown) is formed on the p-type contact layer 18 by, for example, a plasma CVD method. A circular resist pattern (not shown) is further formed on the $SiN_x$ film by the lithography. After that, the $SiN_x$ film is etched by using the resist pattern as a mask by a reactive ion etching (RIE) method using, for example, $CF_4$ as an etching gas. The circular $SiN_x$ film is formed in this manner.

Figure 6:
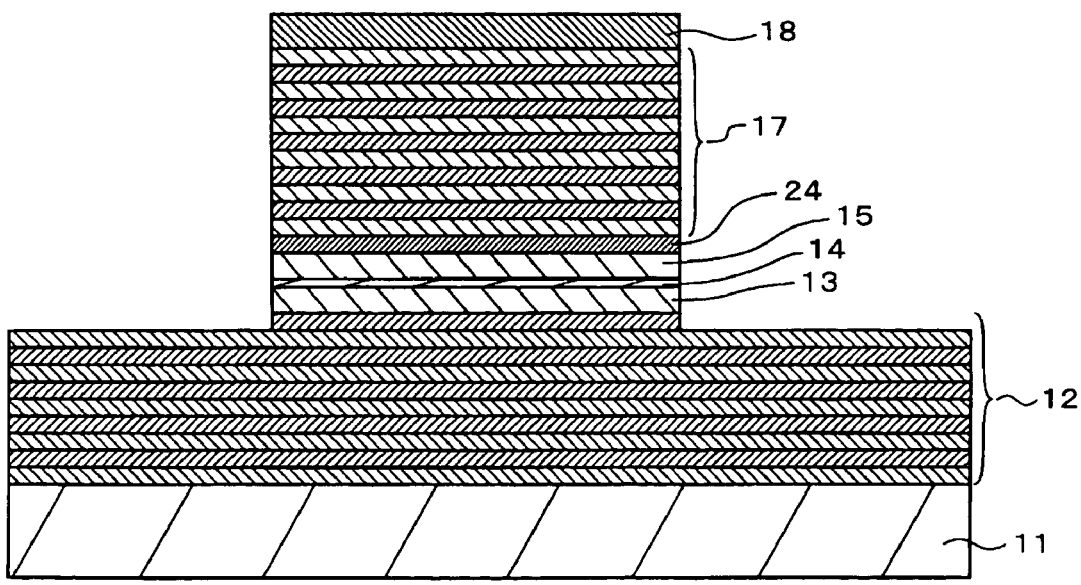
FIG. 6 is a cross sectional view for explaining the manufacturing method of the surface emitting semiconductor laser according to the embodiment of the invention.

The circular $SiN_x$ film formed in this manner is used as an etching mask and the layers up to the n-type GaAs layer 12b as a top layer of the n-type DBR layer 12 are anisotropically etched in the direction perpendicular to the substrate surface by the RIE method using a gas of, for example, the chlorine system as an etching gas. Thus, the n-type GaAs layer 12b as a top layer of the n-type DBR layer 12, the lower clad layer 13, the active layer 14, the upper clad layer 15, the p-type AlAs layer 24, the p-type DBR layer 17, and the p-type contact layer 18 are worked into a post type mesa shape as shown in FIG. 6.

Figure 7:
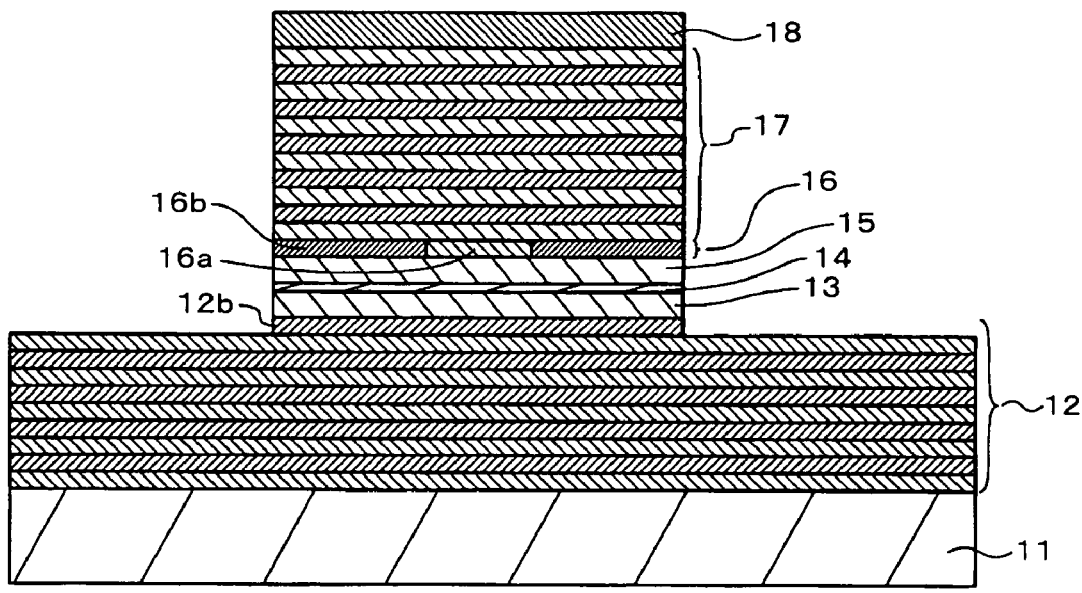
FIG. 7 is a cross sectional view for explaining the manufacturing method of the surface emitting semiconductor laser according to the embodiment of the invention.

Subsequently, the mesa portion formed in this manner is heated at a temperature of, for example, 400° C. for about 25 minutes in a steam atmosphere and only the outer peripheral portion of the p-type AlAs layer 24 is selectively oxidized in a ring shape. Thus, the current constriction layer 16 in which the circular p-type AlAs layer 16a is surrounded by the ring-shaped Al oxide layer 16b is formed as shown in FIG. 7.

Figure 8:
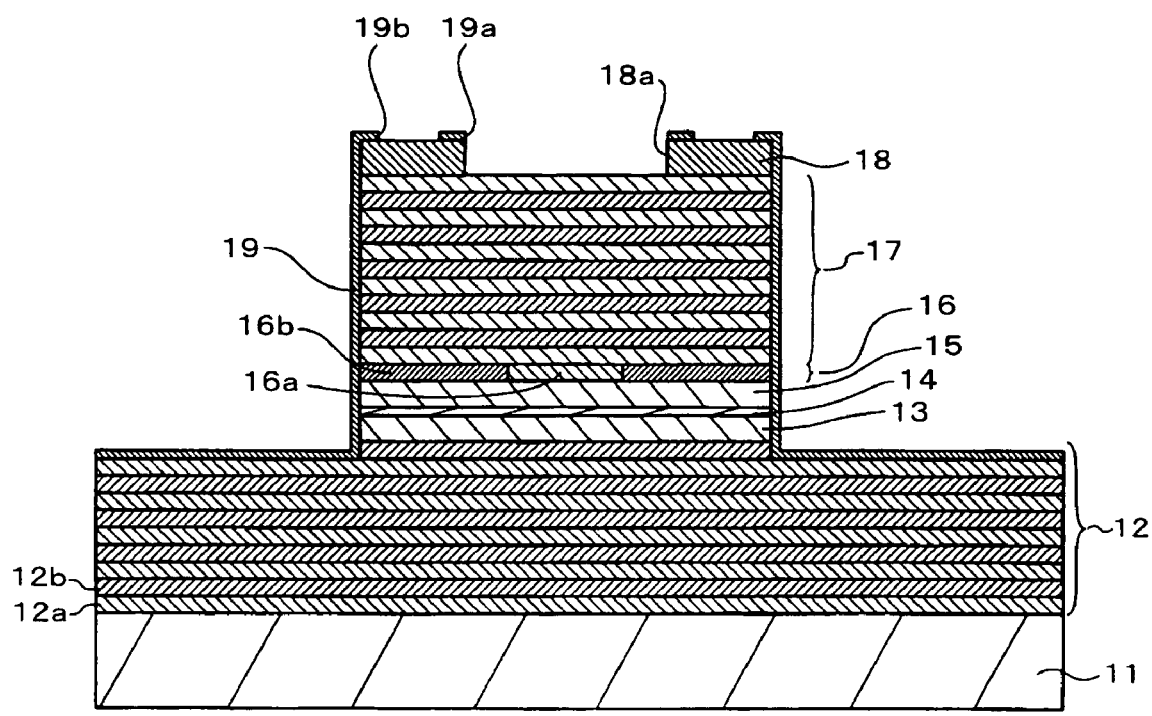
FIG. 8 is a cross sectional view for explaining the manufacturing method of the surface emitting semiconductor laser according to the embodiment of the invention.

Subsequently, the $SiN_x$ film used as an etching mask is etching-removed by, for example, the RIE method. After that, as shown in FIG. 8, the insulative film 19 made of, for example, the $SiO_2$ film, the $SiN_x$ film, or the like is formed on the surface of the mesa portion and the surface of the n-type DBR layer 12 in the portion other than the mesa portion by, for example, a plasma CVD method. Subsequently, the center portion of the insulative film 19 on the mesa post portion is removed by etching, thereby forming the circular opening 19a. After that, by etching the p-type contact layer 18 by using the insulative film 19 as an etching mask, the opening 18a is formed. After that, the portion of the insulative film 19 on the outside of the opening 18a is removed in a ring shape by etching, thereby forming the opening 19b.

Figure 9:
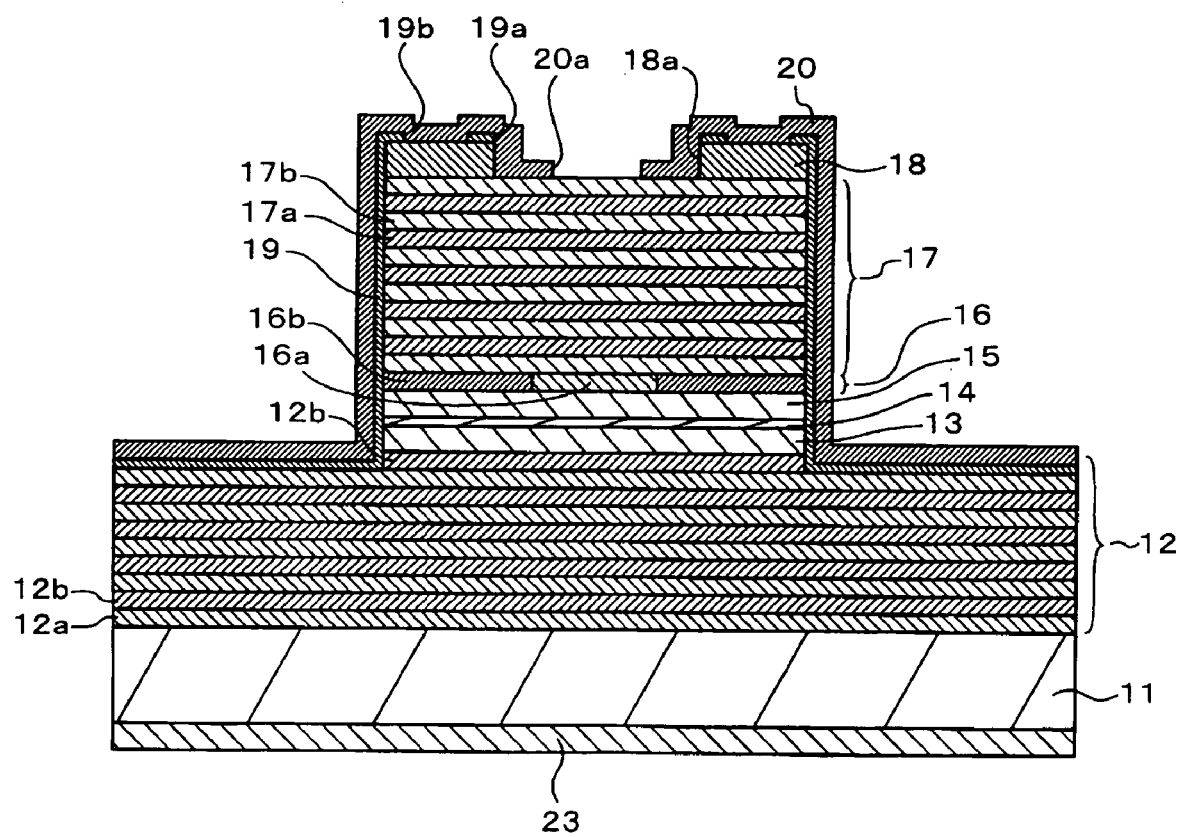
FIG. 9 is a cross sectional view for explaining the manufacturing method of the surface emitting semiconductor laser according to the embodiment of the invention.

Subsequently, as shown in FIG. 9, a Ti/Pt/Au laminate film is formed onto the whole surface by a vacuum evaporation depositing method or the like, thereby forming the p-side electrode 20. After that, by patterning the p-side electrode 20 into a predetermined shape by etching, the opening 20a is formed.

Subsequently, after the n-type semiconductor substrate 11 is polished to a predetermined thickness from the back surface side as necessary, an AuGe/Ni/Au laminate film is formed on the back surface of the n-type semiconductor substrate 11 by the vacuum evaporation depositing method or the like, thereby forming the n-side electrode 23.

Figure 10:
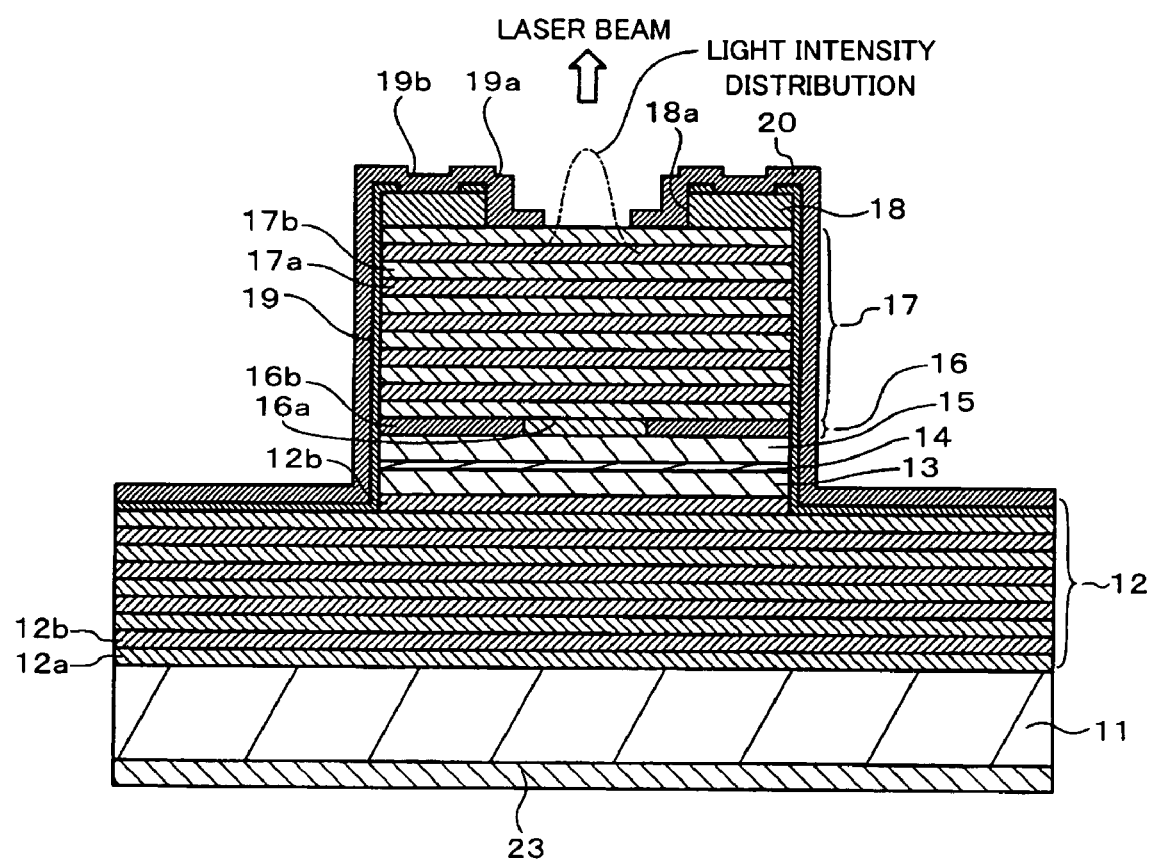
FIG. 10 is a cross sectional view for explaining the manufacturing method of the surface emitting semiconductor laser according to the embodiment of the invention.

Subsequently, as shown in FIG. 10, a laser oscillation is performed by injecting a current of a threshold value or more across the p-side electrode 20 and the n-side electrode 23 of the surface emitting semiconductor laser manufactured as mentioned above. At this time, the injection current is adjusted so that a beam shape of the single peak performance is obtained and the laser beam is extracted from the opening 20a of the p-side electrode 20. In the state where the laser beam having the beam shape of the single peak performance has been extracted as mentioned above, the surface emitting semiconductor laser is subjected to an atmosphere of a high temperature and a high humidity. Specifically speaking, for example, assuming that the temperature is set to 60° C. or more and the humidity is set to 60% or more, the p-type $Al_wGa_{1-w}As$ layer 17b exposed to the surface of an outgoing window is oxidized. This oxidization progresses in accordance with intensity distribution of the laser beam. The oxidization of the portion where the intensity is larger progresses faster. A degree of the oxidization has distribution according to the intensity distribution of the laser beam. As shown in FIG. 4, the Al oxide layer 21 in the flat convex lens shape is formed as mentioned above, so that the refractive index distribution like that of the concave lens is obtained in this portion of the Al oxide film 21. Generally, if the light output is equal to a few mW, it is enough to enable the oxidization to progress.

Subsequently, the protective film 22 is formed on the Al oxide film 21 by the CVD method, coating method, or the like. After that, the laser wafer obtained as mentioned above is formed in a chip shape. The target surface emitting semiconductor laser is manufactured in this manner.

Figure 11:
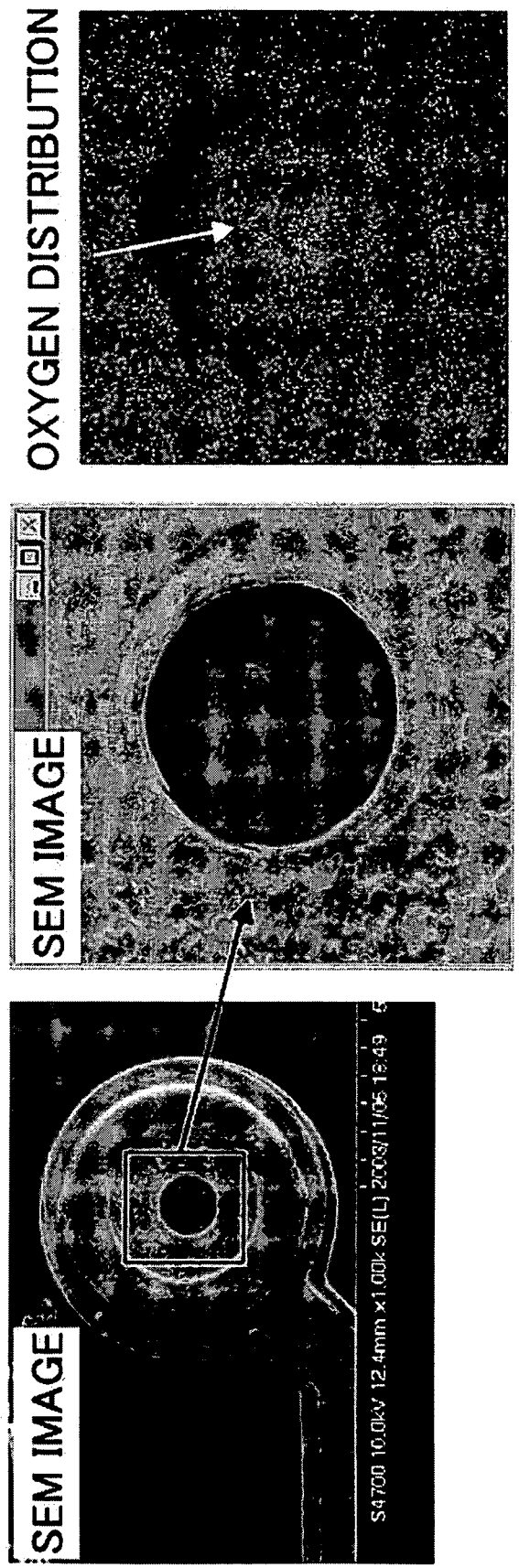
FIGS. 11A to 11C are drawing substitution photographs showing SEM images and oxygen distribution of the portions near the light outgoing portion of the surface emitting semiconductor laser manufactured by the manufacturing method of the surface emitting semiconductor laser according to the embodiment of the invention.

FIG. 11A shows an SEM (Scanning Electron Microscope) photograph of the mesa portion of the surface emitting semiconductor laser in which the Al oxide film 21 has been formed in the outgoing window by the above method. FIG. 11B shows an SEM photograph of portions near the outgoing window of the surface emitting semiconductor laser. FIG. 11C shows oxygen distribution of the outgoing window portion. The Al oxide film 21 is formed by supplying a current of 3 mA to the surface emitting semiconductor laser for 10 hours in the high-temperature and high-humidity atmosphere in which the temperature is equal to 85° C. and the humidity is equal to 85%. The value of w of the p-type $Al_wGa_{1-w}As$ layer 17b exposed to the surface of the outgoing window is equal to 0.5. As shown in FIG. 11C, the center of the opening 20a of the p-side electrode 20 is white and this state corresponds to the state where the concentration of oxygen in the Al oxide layer 21 at the center is higher.

Figure 12:
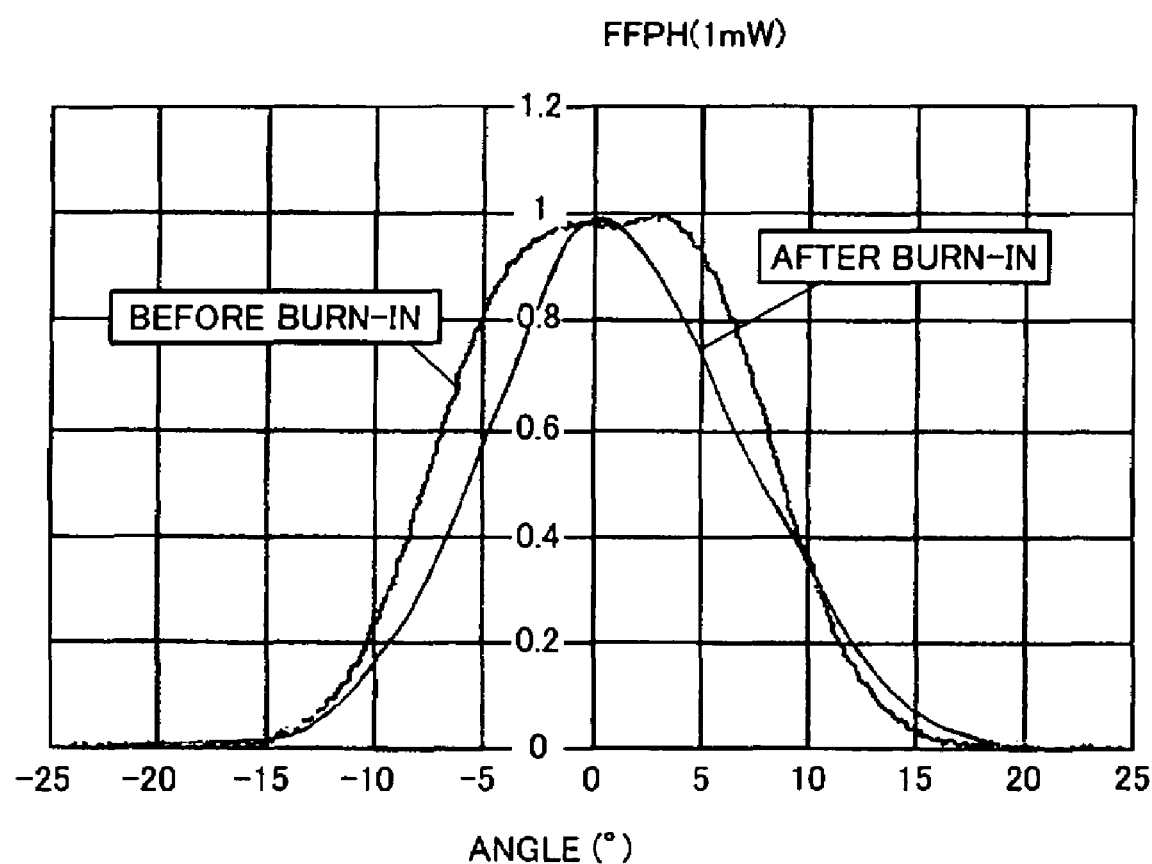
FIG. 12 is a graph showing measurement results of an FFP of the surface emitting semiconductor laser manufactured by the manufacturing method of the surface emitting semiconductor laser according to the embodiment of the invention.

FIG. 12 shows measurement results of FFPH (H wave of FFP) (light output is equal to 1 mW) before and after the process for supplying the current to the surface emitting semiconductor laser in which the Al oxide layer 21 has been formed in the outgoing window by the foregoing method, that is, the burn-in is/was executed. The Al oxide layer 21 is formed by supplying a current of 5 mA to the surface emitting semiconductor laser for 5 hours in the high-temperature and high-humidity atmosphere in which the temperature is equal to 85° C. and the humidity is equal to 85%. The value of w of the p-type $Al_wGa_{1-w}As$ layer 17b exposed to the surface of the outgoing window is equal to 0.5. In FIG. 12, an axis of abscissa denotes an angle measured from a normal direction in the case where the direction of the normal drawn at the center of the outgoing window is used as a reference (0°) and an axis of ordinate indicates the light intensity. It will be understood from FIG. 12 that a half-width value of the FFP after the burn-in is smaller than that before the burn-in by about 30% or more.

According to the embodiment as mentioned above, in addition to use of the structure similar to that described with reference to FIG. 1, since the Al oxide layer 21 is formed in the light outgoing plane (light outgoing window) and the refractive index distribution like that of the concave lens is formed, the higher-order mode can be extremely effectively suppressed upon laser oscillation. The oscillation in the single lateral mode can be stably realized. According to such a surface emitting semiconductor laser, since it is unnecessary to decrease the current constriction diameter too much, that is, the diameter of the p-type AlAs layer 16a, the current constriction structure can be uniformly manufactured on the wafer with high controllability. The manufacturing yield of the surface emitting semiconductor laser can be improved. The device resistance can be decreased. The output and efficient can be improved. Therefore, since it is possible to easily perform impedance matching, high-frequency driving necessary for communication can be also easily performed.

A manufacturing method of an HEMT according to another embodiment of the invention will now be described.

Figure 13A:
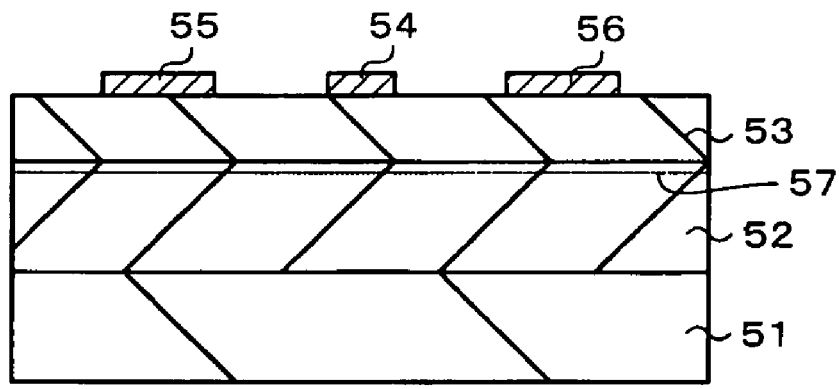
FIGS. 13A and 13B are cross sectional views for explaining a manufacturing method of an HEMT according to another embodiment of the invention.

In the embodiment, as shown in FIG. 13A, first, an undoped GaAs layer 52 serving as an electron running layer and an n-type AlGaAs layer 53 serving as an electron supplying layer are sequentially grown on a semiinsulative GaAs substrate 51 by, for example, the MOCVD method or the like. After that, a gate electrode 54, a source electrode 55, and a drain electrode 56 are formed on the n-type AlGaAs layer 53. A 2-dimensional electron gas (2DEG) 57 exists in the undoped GaAs layer 52 near a heterojunction interface between the undoped GaAs layer 52 and the n-type AlGaAs layer 53.

Figure 13B:
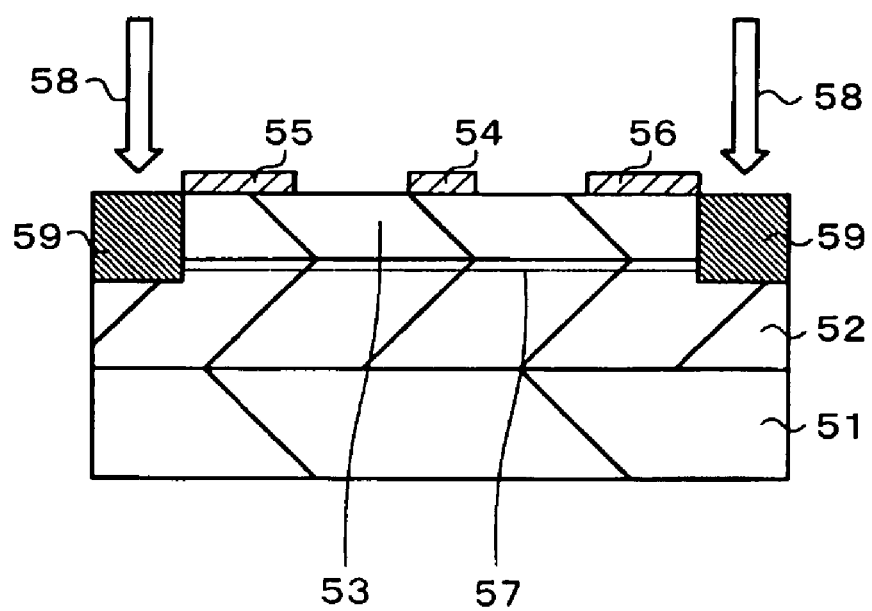

Subsequently, as shown in FIG. 13B, while irradiating a laser beam 58 onto the surface of the portion serving as a device separating region of the n-type AlGaAs layer 53 from the outside, the surface of the n-type AlGaAs layer 53 is subjected to an oxidizing atmosphere such as a steam atmosphere, thereby executing the oxidation and forming an oxide layer 59. The oxide layer 59 is formed to a depth which reaches the undoped GaAs layer 52, thereby enabling the 2-dimensional electron gas 57 existing in the undoped GaAs layer 52 near the heterojunction interface between the undoped GaAs layer 52 and the n-type AlGaAs layer 53 to be perfectly separated by the oxide layer 59. In this manner, the device separation is performed by the oxide layer 59.

According to the second embodiment, the device separation of the HEMT can be easily performed by selectively irradiating the laser beam in the oxidizing atmosphere.

Although the embodiments of the invention have specifically been described above, it should be understood by those skilled in the art that various modifications, combinations, sub-combinations and alterations may occur depending on design requirements and other factors insofar as they are within the scope of the appended claims or the equivalents thereof.

For example, the numerical values, materials, structures, shapes, substrates, processes, and the like mentioned in the foregoing embodiments are merely shown as examples and numerical values, materials, structures, shapes, substrates, processes, and the like different from them can be also used as necessary.

For example, as for the creation of the Al oxide layer 16b by the selective oxidation of the p-type AlAs layer 24, it can be also formed by the following method.

That is, the creation of the Al oxide layer 16b by the selective oxidation of the p-type AlAs layer 24 is generally performed by a method whereby after the post type mesa structure is formed by etching, the wafer is heated in the steam at temperatures of about 300 to 500° C. However, in the steps after the selective oxidizing step, if the wafer is heated to a temperature (300 to 500° C.) similar to that in the selective oxidizing step, there is a case where the oxidation of the non-oxidized portion of the p-type AlAs layer 24 in which an amount of Al composition is large progresses. Since its oxidization constriction shape and its area exercise a large influence on characteristics of the surface emitting semiconductor laser, it is necessary to suppress the progress of the oxidization. To suppress the progress of the oxidization in the heating step after the selective oxidation, it is preferable to specify conditional parameters in the selective oxidizing step so that a reaction rate is obtained. By performing the selective oxidization under the condition of the reaction rate as mentioned above, wafer intra-plane uniformity of the oxidization constriction due to the creation of the Al oxide layer 16b can be improved. This method will be specifically explained as follows.

Figure 14:
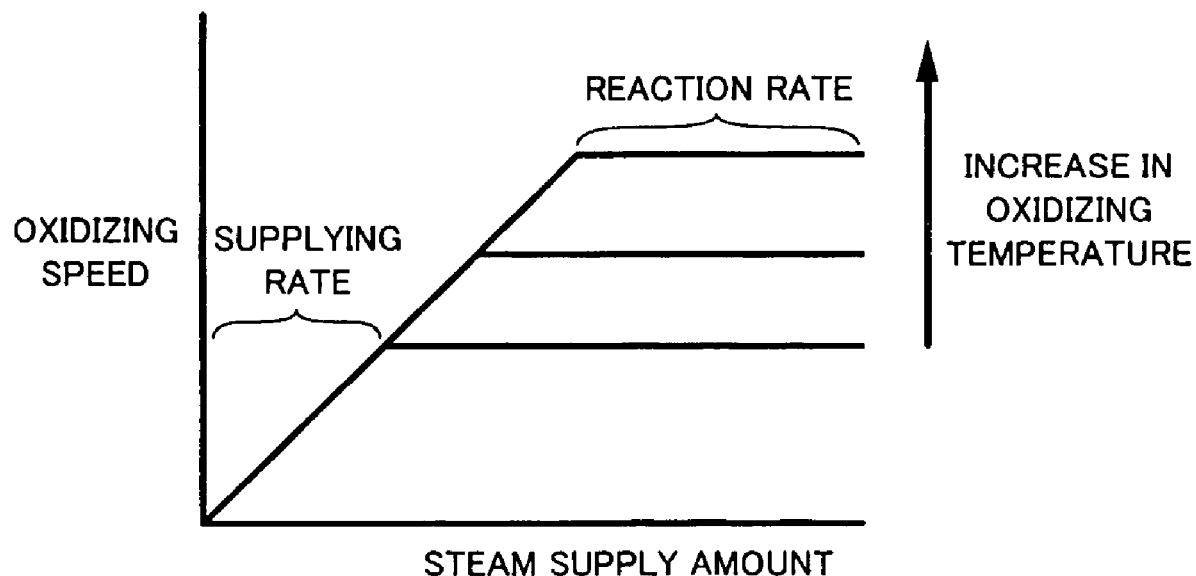
FIG. 14 is a schematic diagram for explaining a forming method of a current constriction layer.
Figure 15:
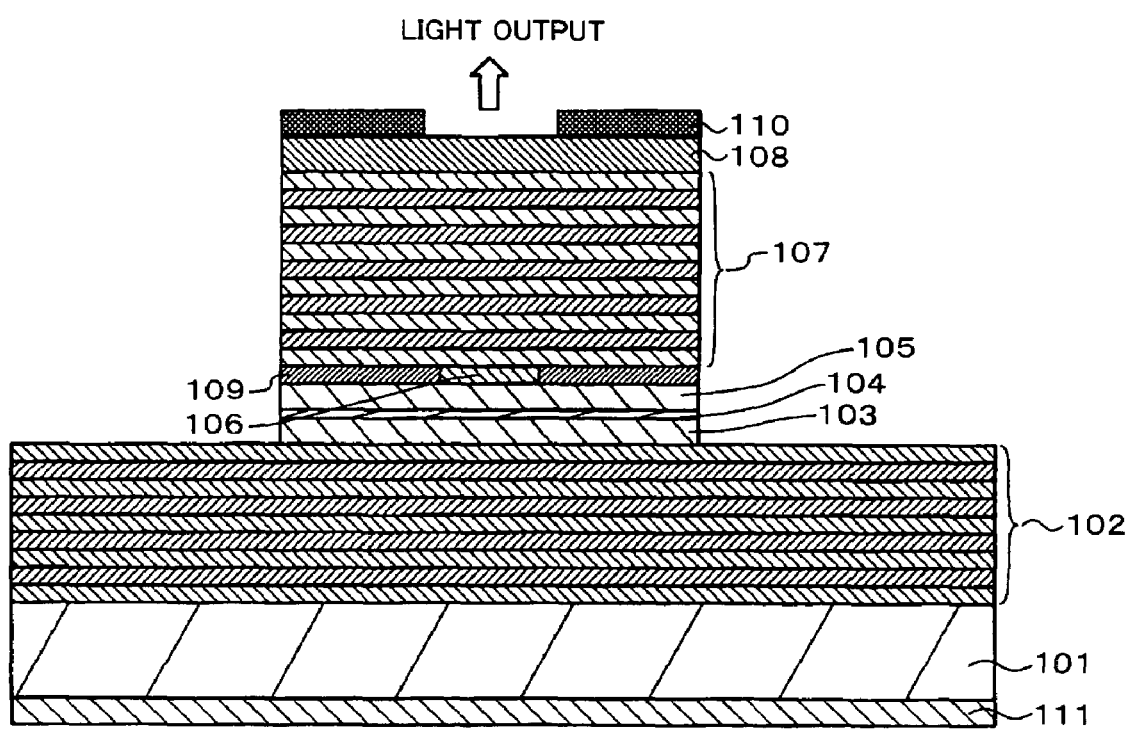
FIG. 15 is a cross sectional view showing a conventional surface emitting laser of a post type mesa structure.
Figure 16:
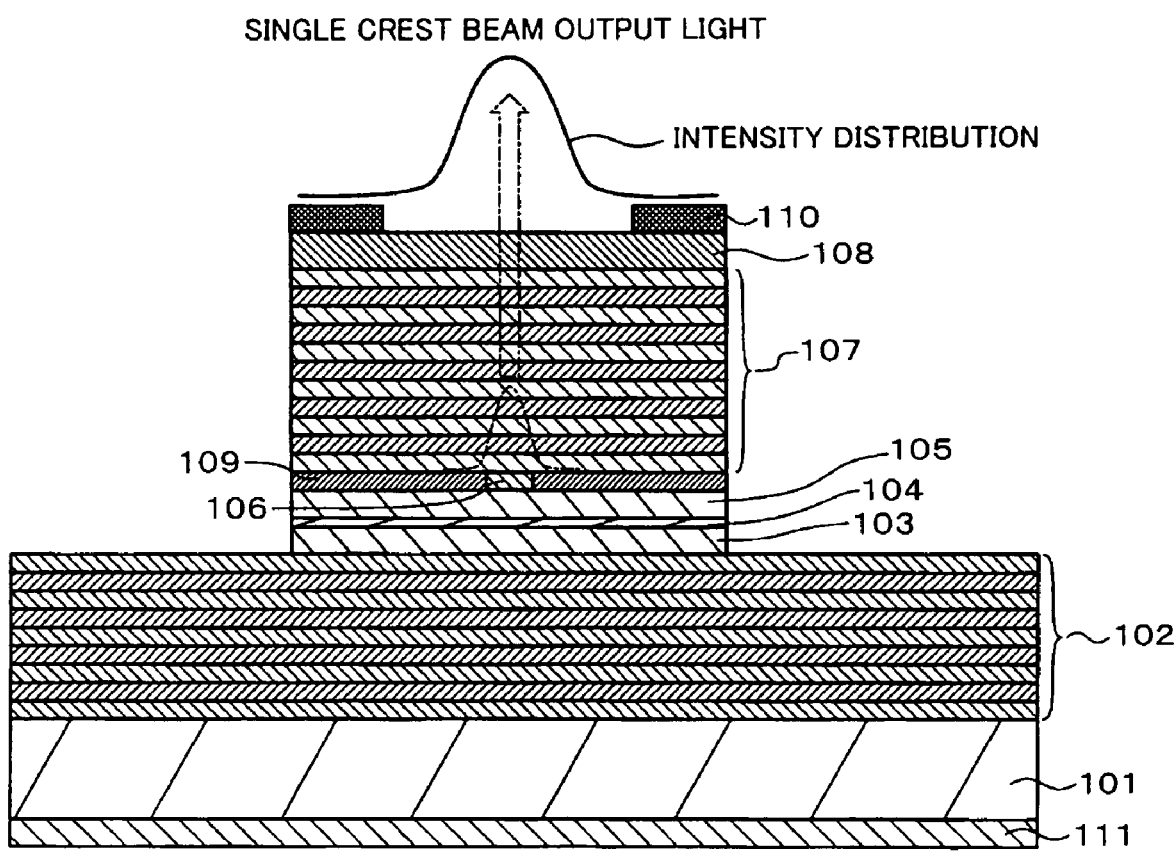
FIG. 16 is a cross sectional view showing a conventional surface emitting laser of a post type mesa structure.

The conditional parameters in the selective oxidizing step include a supply amount of the steam and an oxidizing temperature (substrate temperature). There is such a relation that, if the oxidizing temperature is fixed, as shown in FIG. 14, an oxidizing speed increases in proportion to the supply amount of the steam and, when the supply amount exceeds a predetermined supply amount, the oxidizing speed is saturated. The oxidizing reaction becomes the supply rate of the steam in the proportional region and becomes a reaction rate in the saturated region. The reaction rate denotes the state where the oxidizing speed depends on the reaction speed by supplying the steam of an amount which is equal to or larger than the amount necessary for the oxidizing reaction. When the steam amount is small, since the oxidizing speed depends on the steam amount, such a state is called a supplying rate.

The reaction rate and the supplying rate can be also described as follows. As shown in FIG. 14, the oxidizing speed is divided into a region where it increases in proportion to the supply amount of the steam and a region where the oxidizing speed is saturated. At a certain oxidizing temperature, when the steam amount necessary for the oxide layer to perform the oxidizing reaction at a limit speed is compared with the amount of steam which is actually supplied, the following two states exist.

(steam amount necessary for reaction)>(steam supply amount)  (1)

(steam amount necessary for reaction)≦(steam supply amount)  (2)

Assuming that the parameters of the oxidizing reaction are the steam amount and the heat (oxidizing temperature), it is possible to consider that in the case of (1), the limit value of the oxidizing speed is restricted by the steam amount and, in the case of (2), it is restricted by the heat. Therefore, the case of (1) is called a supplying rate of the steam and the case of (2) is called a reaction rate.

A specific example is now mentioned. When the substrate temperature is equal to 450° C. and a flow rate of a carrier gas ($N_2$) is equal to 11 slm (standard liter/min), even if the steam supply amount changes from 0.38 g/min to 1.14 g/min, which is three times as large as 0.38, the oxidizing speed hardly changes. The region where even if the steam supply amount changes, the oxidizing speed hardly changes exists as mentioned above. This region is called a reaction rate. In the case of the above conditions, when the steam supply amount is equal to or larger than at least 0.38 g/min, the oxidizing speed can be set to the reaction rate.

It has been found that when the oxidization is performed in the above supplying rate region, the oxidization progresses in the subsequent heating step, however, when the oxidization is performed in the region of the reaction rate, the oxidization hardly progresses. Consequently, the unexpected progress of the oxidization can be suppressed by the oxidization under the reaction rate condition. An aging change of the characteristics can be suppressed by the suppression of the progress of the oxidization. In the oxidizing reaction at the reaction rate, if the substrate temperature is uniform, even when there is a slight fluctuation in the supply amount of the steam, the reaction speed does not change. Therefore, the uniformity of the oxidizing speed in the wafer plane can be improved.

According to devices other than the surface emitting semiconductor laser, similar effects can be also obtained by the device including the step of oxidizing the layer containing Al by using the steam.

What is claimed is:

1. A surface emitting semiconductor laser which comprises a first reflective layer,
an active layer on said first reflective layer, and a second reflective layer on said active layer and extracts output light from said second reflective layer, wherein an oxide layer having predetermined refractive index distribution is formed on said second reflective layer, and wherein said oxide layer is formed by oxidizing a compound semiconductor layer containing Al, and further wherein a density of an Al oxide coupling in the oxide layer increases from its outer peripheral portion toward its center portion and becomes the maximum in the center portion.

2. A laser according to claim 1, wherein said predetermined refractive index distribution is obtained from distribution of a thickness and/or a composition of said oxide layer.

3. A laser according to claim 1, wherein said predetermined refractive index distribution is refractive index distribution like that of a concave lens.

4. A laser according to claim 1, wherein said oxide layer is an Al oxide layer.

5. A laser according to claim 1, wherein said compound semiconductor layer containing Al is a III-V group compound semiconductor layer containing Al.

6. A laser according to claim 5, wherein said III-V group compound semiconductor layer containing Al is an AlGaAs layer or an AlGaInP layer.

7. A laser according to claim 1, wherein each of said first reflective layer and said second reflective layer is made of a semiconductor multilayer film.

8. A laser according to claim 1, wherein each of said active layer and said second reflective layer has a cylindrical shape.

9. A laser according to claim 1, wherein a contact layer having a circular opening is formed on said second reflective layer and said oxide layer is formed on said second reflective layer in said opening of said contact layer.

10. A laser according to claim 9, wherein an electrode having a circular opening whose diameter is smaller than that of said opening of said contact layer is formed over said contact layer and said second reflective layer, and said oxide layer is formed on said second reflective layer in said opening of said electrode.

11. A laser according to claim 10, wherein an insulative layer is formed between said contact layer and said electrode.

12. A laser according to claim 1, wherein a protective film is provided so as to cover said oxide layer.

* * * * *